United States Patent
He et al.

(10) Patent No.: US 11,727,980 B2
(45) Date of Patent: Aug. 15, 2023

(54) APPARATUSES AND METHODS FOR SINGLE-ENDED GLOBAL AND LOCAL INPUT/OUTPUT ARCHITECTURE

(71) Applicant: MICRON TECHNOLOGY, INC., Boise, ID (US)

(72) Inventors: Yuan He, Boise, ID (US); Luoqi Li, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/217,981

(22) Filed: Mar. 30, 2021

(65) Prior Publication Data
US 2022/0319576 A1    Oct. 6, 2022

(51) Int. Cl.
*G11C 11/4094*   (2006.01)
*G11C 11/4091*   (2006.01)
*G11C 11/4074*   (2006.01)
*G11C 11/4093*   (2006.01)

(52) U.S. Cl.
CPC ...... *G11C 11/4091* (2013.01); *G11C 11/4074* (2013.01); *G11C 11/4093* (2013.01); *G11C 11/4094* (2013.01)

(58) Field of Classification Search
CPC .................................................. G11C 11/4091
See application file for complete search history.

(56) References Cited

U.S. PATENT DOCUMENTS

| 2004/0042276 A1* | 3/2004 | McElroy | G11C 7/065 365/207 |
| 2006/0268648 A1* | 11/2006 | Dang | G11C 11/417 365/230.03 |
| 2007/0280030 A1* | 12/2007 | Ramaraju | G11C 8/16 365/230.06 |
| 2015/0117120 A1* | 4/2015 | Barth, Jr. | G11C 11/4094 365/189.05 |
| 2015/0357022 A1* | 12/2015 | Hush | G11C 11/4093 365/72 |
| 2022/0068354 A1* | 3/2022 | He | G11C 11/4096 |

* cited by examiner

*Primary Examiner* — Min Huang
(74) *Attorney, Agent, or Firm* — Dorsey & Whitney LLP

(57) ABSTRACT

Apparatuses, systems, and methods for single-ended global and local input/output architecture. A conventional memory may use local input/output (LIO) and global input/output (GIO) lines which are paired and carry complimentary signals. The present disclosure includes single ended LIO and GIO architecture where a single LIO couples a single GIO between a read/write amplifier and bit line as part of an access operation. This may reduce a footprint of the memory device.

18 Claims, 11 Drawing Sheets

APPARATUSES AND METHODS FOR SINGLE-ENDED GLOBAL AND LOCAL INPUT/OUTPUT ARCHITECTURE

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), which in turn may be coupled to a sense amplifier. Along with the digit line coupled to the memory cell, a second, complimentary digit line may also be coupled to the sense amplifier. These complimentary digit lines may in turn be coupled to complimentary local input/output lines and complimentary global input/output lines. The use of complimentary signal lines may be useful for providing a reference voltage level to better distinguish the value being read from/written to the memory cell, but at the cost of increased space and power consumption, as transistors are needed for both lines. There is increasingly a need for memory devices with reduced size and memory consumption.

DETAILED DESCRIPTION

Figure 1:
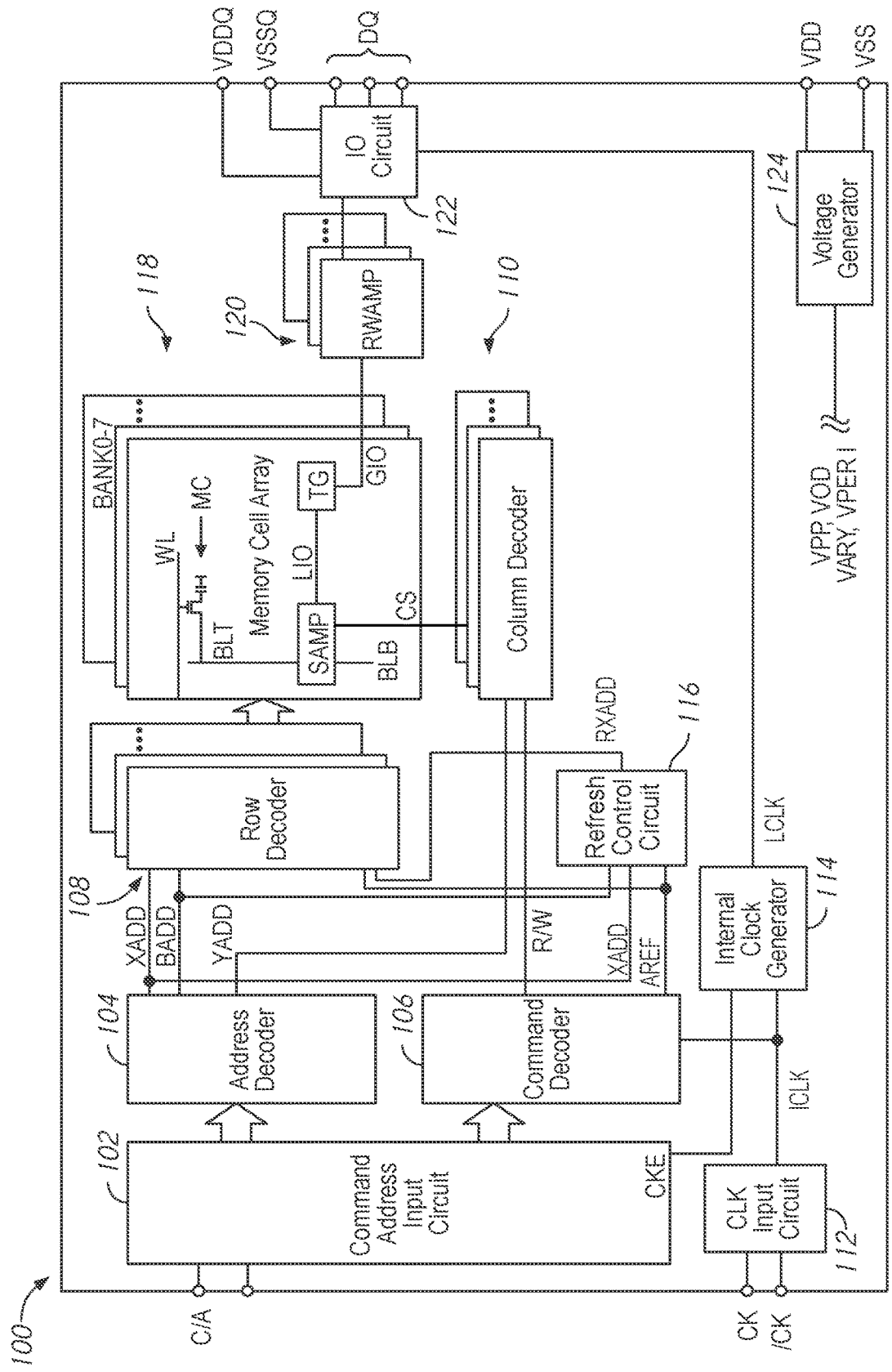
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices may include a memory array which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses. When a memory cell is accessed (e.g., a read or write operation), the memory cell may be coupled via the bit line to a sense amplifier. For example in a read operation, the value stored in the memory cell (e.g., as a capacitive charge) may change a voltage of the bit line. The sense amplifier may detect this change, amplify the voltage to a system level (e.g., a voltage which represents logical high or a voltage which represents logical low) and then provide those voltages along a local input/output line (LIO) and global input/output line (GIO) to read/write amplifiers, which in turn may send the voltage to data terminals of the memory. During an example write operation, the process may generally be reversed (e.g., from GIO to LIO, to sense amplifier to bit line to memory cell).

In a conventional memory device, the sense amplifier, LIO and GIO may use a complimentary, double-ended architecture. In a double-ended architecture, the sense amplifier may be coupled to a first digit line, which is coupled to the accessed memory cell, and a second digit line. The second digit line may have a value which is complimentary to the value of the first digit line. For example, if a logical high is read from the accessed memory cell, the sense amplifier may drive the first digit line to a first voltage which represents a logical high, and the second digit line to a second voltage which represents a logical low. These voltages may then be read out along a pair of complimentary LIO lines, and a pair of complimentary GIO lines. The use of complimentary signals and signal lines may be useful for differentiating between different voltages (e.g., by comparing the complimentary values). However the additional signal lines, and the transistors to operate that second signal line, may take up additional space on the memory device.

The present disclosure is drawn to apparatuses, systems, and methods for single-ended LIO and GIO memory devices. In an example memory device of the present disclosure, there may be a single LIO and GIO. Accordingly, during an example read operation, the sense amplifier may drive a first digit line and second digit line to complimentary voltages, but only one voltage is coupled to the LIO (and in turn to the GIO). During an example write operation, a voltage may be provided along the GIO and LIO and the sense amplifier may drive the voltages of the first and the second bit line based on the voltage on the LIO. The use of a single-ended architecture (e.g., no second complimentary LIO and GIO) may allow for space saving, as the second GIO and LIO may be omitted. In addition, as explained in more detail herein, further space saving may be achieved by using a control architecture for the GIO and LIO which may take up less space/power than the control architecture used in conventional double ended architectures. The present disclosure may also relate to a method of operating the read and write circuits of a single ended LIO/GIO architecture which may reduce the space required (e.g., by reducing the number of transistors) for read and write circuits.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BLT and BLB, and a plurality of memory cells MC arranged at intersections of the plurality of word lines WL and the plurality of bit lines BLT and BLB. The selection of the word line WL is performed by a row decoder 108 and the selection of the bit lines BLT and BLB is performed by a column decoder 110. In the embodiment of FIG. 1, the row decoder 108 includes a respective row decoder for each memory bank and the column decoder 110 includes a respective column decoder for each memory bank. The bit lines BLT and BLB are coupled to a respective sense amplifier (SAMP). Read data from the bit line BLT or BLB is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BLT or BLB.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
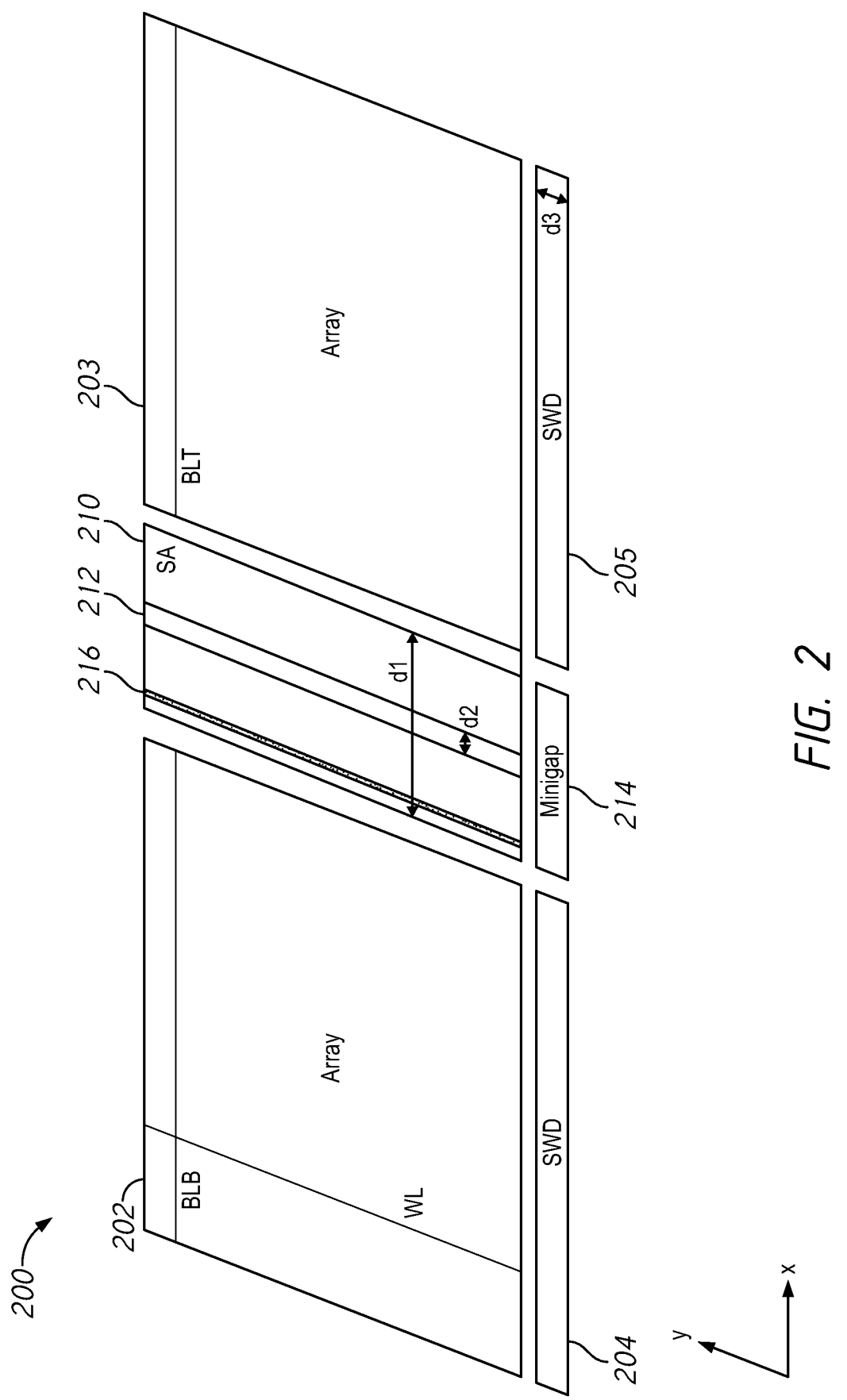
FIG. 2 is a block diagram of an example layout of a memory device according to some examples of the present disclosure.

FIG. 2 is a block diagram of an example layout of a memory device according to some examples of the present disclosure. The memory 200 may, in some embodiments, represent a layout of a portion of a memory array, such as the memory array 118 of FIG. 1. The memory 200 shows a representation of a portion of a memory array. The components shown in FIG. 2 may be repeated (e.g., tiled) across a memory array. FIG. 2 represents a simplified view of different regions across the surface of a chip. Additional components not shown in FIG. 2 may also be present in the memory array.

The memory 200 includes two array regions 202 and 203, each of which includes a number of memory cells arranged at the intersection of word lines and bit lines. The array regions 202 and 203 are separated from each other by a sense amplifier (SA) region 210. The SA region 210 includes sense amplifiers which selectively couple an accessed memory cell in one of the array regions 202 or 203 to a local input/output (LIO) line 216. The SA region 210 includes a read/write gap (RW gap) regions 212, which includes circuits used to selectively activate one or more of the sense amplifiers in the SA region 210. Adjacent to each array region 202 and 203 is a respective sub-word line driver (SWD) region 204 and 205 respectively. The SWD regions 204 and 205 may include driver circuits which may activate word lines of the array region as part of an access operation. The SWD regions 204 and 205 may be separated by a minigap region 214.

During an access operation on an example memory cell in the first memory array region 202, the SWD 204 may activate a word line WL based on signals from a row decoder (e.g., 108 of FIG. 1). The memory cell may lie at the intersection of the word line WL and a bit line BLB. A sense amplifier in the SA region 210 to be coupled to the bit line BLB and also a complimentary bit line BLT in the other array region 203. The RW gap 212 may include circuits which control the timing and operation of the sense amplifier to amplify a voltage along BLB based on the signal read out from the activated memory cell. Selection circuits (such as those in the SA region 210) may receive a column select signal CS (e.g., from a column decoder 110 of FIG. 1) which may couple the bit line BLT to the LIO line 216.

The SA region 210 may have a width d1 in an x direction. The RW gap 212 has a width d2 in the x direction. The distance d1 may be reduced compared to a memory which uses two LIO lines per SA region. Similarly the distance d2 may be reduced compared to a memory where the RW gap 212 needs to include circuits which operate two different LIO lines. This may help reduce the footprint of the memory array. In addition, the minigap 214 may have a width in the x direction based on the width of the SA 210 (e.g., a width based on d1) and a height in the y direction based on the height of the SWD d3. Accordingly if the present disclosure which reduces the distance d1 is coupled with SWDs of reduced height, they may synergize to further reduce the footprint of the memory beyond the reduction achieved by the narrowed distance d1.

Figure 3:
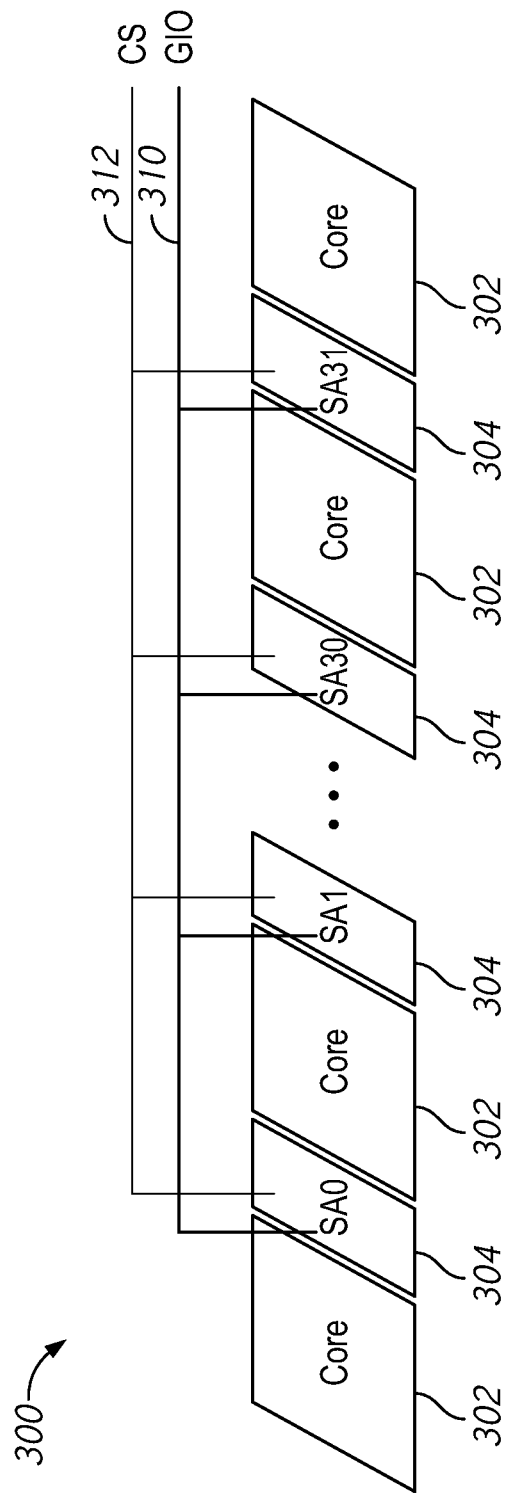
FIG. 3 is a block diagram of a memory array according to some embodiments of the present disclosure.

FIG. 3 is a block diagram of a memory array according to some embodiments of the present disclosure. The memory array 300 may, in some embodiments, be included in the memory 100 of FIG. 1 and/or 200 of FIG. 2. The memory array 300 shows a view of a memory which illustrates how a global input/output (GIG) line and column select (CS) are coupled to different sense amplifier regions across the memory array 300.

The memory array 300 includes a number of core or array regions 302 (e.g., 202 and 203 of FIG. 2) which are separated from each other by sense amplifier regions 304 (e.g., 210 of FIG. 2). Each sense amplifier region 304 includes a LIO line, which is coupled to the GIG line 310. A CS line 312 couples column select signals into the sense amplifier regions 304. The GIO line 310 may couple information between the sense amplifier regions 304 and the RW amplifiers (e.g., 120 of FIG. 1), not shown.

As may be seen from FIG. 3, there may be several LIO lines all coupled to the same GIO. In some embodiments, there may also be more than one GIO. Accordingly, references to single-ended architecture, or to a single LIO used as part of an access operation, should not be interpreted as requiring that there be only one LIO on the device.

Figure 4:
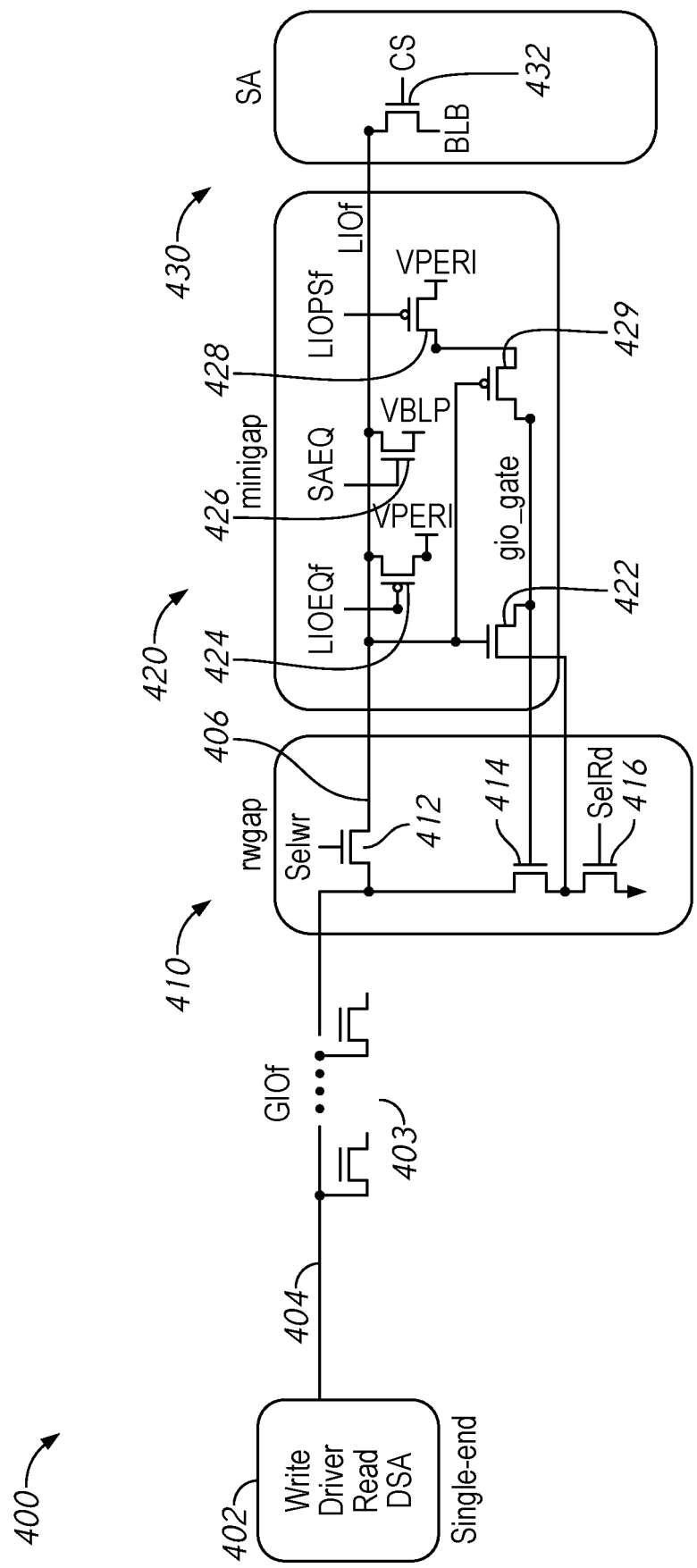
FIG. 4 is a schematic diagram of selection architecture of a memory device according to some embodiments of the present disclosure.

FIG. 4 is a schematic diagram of selection architecture of a memory device according to some embodiments of the present disclosure. The architecture 400 represents a path from a read write amplifier 402 to a bit line BLB (and from there to the memory cell). The diagram of the architecture 400 represents a simplified view in which many components have been omitted. For example, in the sense amplifier 430, a large number of components have been omitted for the sake of clarity while explaining the signal which couple the bit line BLB to the LIO. An example sense amplifier is explained in more detail in FIG. 8. The architecture 400 also represents a specific division of components between different regions of the memory array, however other arrangements are possible in other example embodiments.

The present disclosure may generally be described with respect to information read to and written from a bit line BLB, which may store a complimentary value to a 'true' bit line BLT. Accordingly, the LIO may be labelled as a complimentary line LIOf and the GIO may be labelled as a complimentary GIOf. However it should be understood that these are merely conventions, and that other embodiments may involve coupling to the bit line BLT in which case the naming conventions LIO and GIO may be used. The labels LIOf and GIOf may be used to indicate that access operations are described with respect to the bit line BLB. However, it should be understood that there is no complimentary line to GIOf and LIOf in the single-ended architecture of the present disclosure, and the use of the 'f' is only a naming convention and is not meant to indicate a contrast to another GIO and LIO line.

The architecture 400 shows a RW amplifier 402 (e.g., 120 of FIG. 1) which is coupled via a GIOf 404 to components in an RW gap region 410 (e.g., 212 of FIG. 2) and minigap region 420 (e.g., 214 of FIG. 2) to a sense amplifier 430 (e.g., in SA region 210 of FIG. 2) and through the sense amplifier 430 to a bit line BLB which couples to a memory cell. Each of the regions 410, 420 and 430 include transistors which may be operated to selectively couple information to and from the bit line BLB, and which may also be used to couple one or more signal lines to system voltages such as VPERI and VSS, for example to precharge the LIOf.

The RW driver 402 is coupled to the GIOf 404, which couples into the RW gap 410 of a particular SA region. The GIOf 404 may have several transistors 403 along its length, which have anode coupled to the GIOf. The transistors 403 may represent other connections to the GIOf 404. For example, the transistors 403 may represent write select transistors (e.g., 412) or other components in the RW gap 410 (e.g., transistor 414). For the sake of clarity in the drawing other components and details are not shown with respect to these other transistors 403.

The GIOf 404 is coupled to circuits of the RW gap 410. The GIOf 404 may be coupled in common to the node of a first transistor 412 and a second transistor 414. The first transistor 412 has a node coupled to the LIOf 406 and a gate coupled to a write select signal SelWr. Accordingly, as part of a write operation, when the signal SelWr is active, the GIOf 404 is coupled to the LIOf 406. The transistor 414 has a node coupled to the node of transistor 416 and to a node of transistor 422 in the minigap region 420, and a gate coupled to a signal gio_gate. The transistor 416 has a node coupled to a ground voltage (e.g., VSS) and a gate coupled to a select read signal SelRd 416. Accordingly, as part of a read operation, when SelRd is active, the transistor 416 couples the node of transistors 414 and the node of transistor 422 to ground. This may activate an inverter formed by transistors 422 and 429. The transistors 412, 414, and 416 may be n-type transistors in some embodiments.

In the minigap region 420, transistors 424 and 426 may be used to control a voltage along the LIOf 406. Transistor 424 has a node coupled to LIOf 406, a node coupled to the system voltage VPERI and a gate coupled to a signal LIOEQf. The transistor 424 may be a p-type transistor. Accordingly, when the signal LIOEQf is at a voltage representing a logical low (e.g., inactive), the transistor 424 may be active and may couple the LIOf 406 to VPERI. The transistor 426 has a node coupled to the LIOf 406, a node coupled to a voltage VBLP, and a gate coupled to the signal SAEQ. The transistor 426 may be an n-type transistor. Accordingly, when the signal SAEQ is active, the LIOf 406 may be coupled to the voltage VBLP.

The minigap region 420 also includes transistors 422 and 429, each of which has a gate coupled to the LIOf 406. The transistor 422 has a node coupled to a signal gio_gate and a node coupled to the node between transistors 414 and 416 in the RW gap region 410. The transistor 429 has a node coupled to a node of a transistor 428 and a node coupled to the signal gio_gate. The transistor 422 may be an n-type transistor, while the transistor 429 may be a p-type transistor. Accordingly, when LIOf 406 is at a high logical level, the transistor 422 may couple the signal gio_gate to the node between transistor 414 and 416. In which case if gio_gate is at a low logical level (e.g., at a ground voltage) then the transistor 414 may be inactive, and the GIOf may remain at a voltage representing a logical high (e.g., VPERI). The transistors 422 and 429 may act together as an inverter to invert the signal along LIO 406 to the signal gio_gate when the inverter is active (e.g., when the signals SelRd is high and LIOPSf is low).

When the LIOf 406 is at a low logical level, the transistor 429 may be active, and the voltage provided by transistor 428 may be provided to the gate of transistor 414. However the transistor 422 may remain inactive, and so the node between transistors 414 and 416 is not coupled to gio_gate. The transistor 428 has a node coupled to VPERI, a node coupled to the node of transistor 429, and a gate coupled to the signal LIOPSf. The transistor 429 may be a p-type transistor. Accordingly, when the signal LIOPSf is at a logical low, the voltage VPERI is coupled to the node of the transistor 429 (and potentially to gio_gate if the voltage on LIO 406 is a logical low).

In the sense amplifier region 430, the LIOf 406 is coupled to a bit line BLB by transistor 432. The transistor 432 has a node coupled to LIOf, a node coupled to BLB, and a gate coupled to a column select signal CS. The signal CS may be provided by a column decoder at an active level when information along the bit line BLB is accessed.

Figure 5:
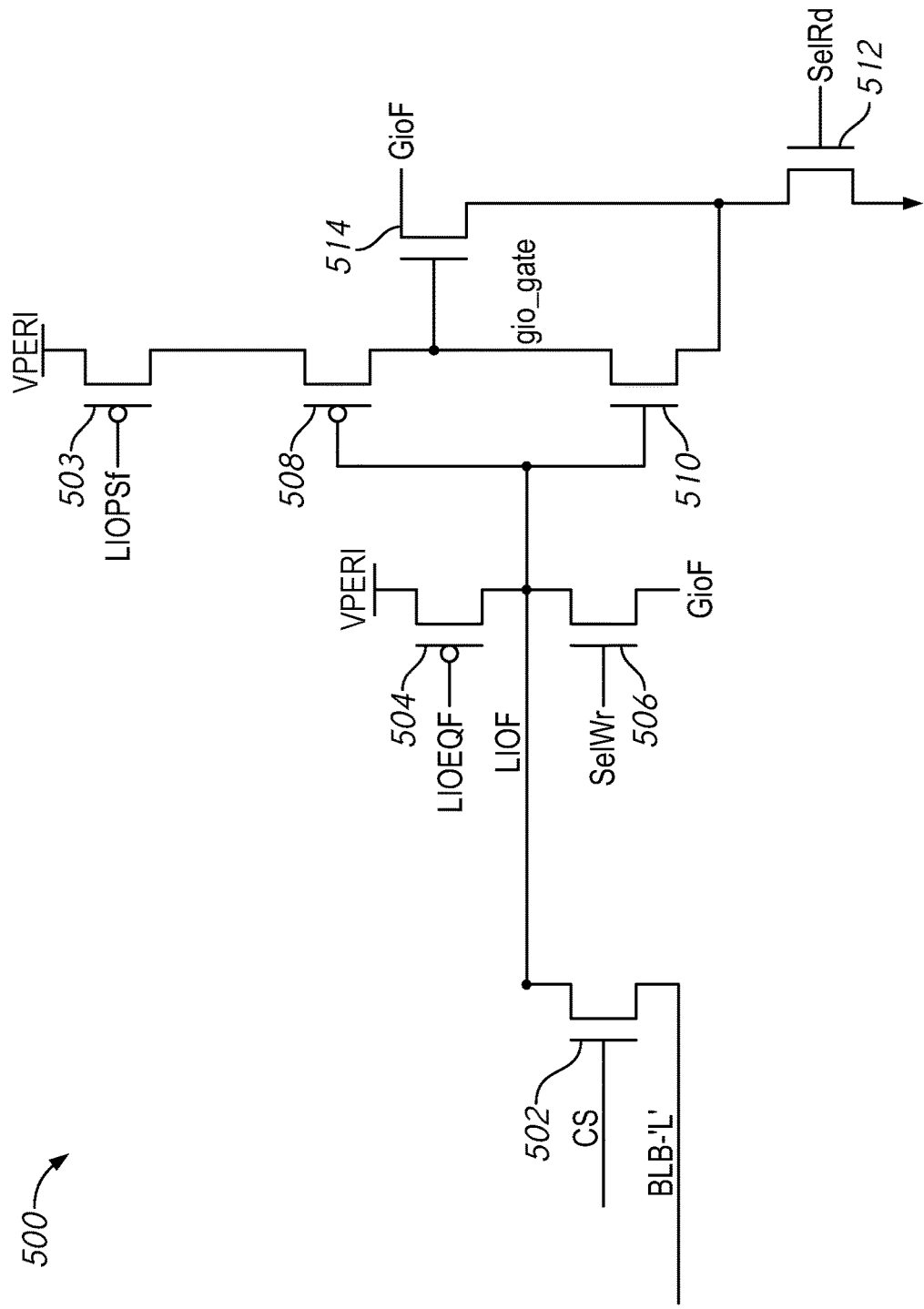
FIG. 5 is a schematic diagram of circuits related to a read operation according to some embodiments of the present disclosure.

FIG. 5 is a schematic diagram of circuits related to a read operation according to some embodiments of the present disclosure. The read circuits 500 shows certain components used to operate a read operation from a bit line BLB to a global input/output GIOf. The read circuits 500 may, in some embodiments, represent a portion of the architecture 400 of FIG. 4.

A transistor 502 (e.g., 432 of FIG. 4) has nodes coupled to the bit line BLB and the LIOf and a gate coupled to a column select signal CS. The transistor 502 may be an n-type transistor. When the signal CS is active, the bit line BLB may be coupled to LIOf. A transistor 504 (e.g., 424 of FIG. 4) has nodes coupled to system voltage VPERI and the LIOf, and a gate coupled to equalization signal LIOEQf. The transistor 504 may be a p-type transistor. When the signal LIOEQf is low, the transistor may couple the voltage VPERI onto the local input/output LIOf. The transistor 506 (e.g., 412 of FIG. 4) has nodes coupled to LIOf and GIOf, and a gate coupled to write select signal SelWr. The transistor 506 may generally be kept inactive during a read operation. A write operation is discussed in more detail in FIGS. 8-10.

A transistor 503 (e.g., 428 of FIG. 4) has nodes coupled between a system voltage VPERI and a node of transistor 508. The transistor 503 has a gate coupled to a signal LIOPSf. The transistor 503 may be a p-type transistor and accordingly, when the signal LIOPSf is at a low level, the transistor 503 may be active, coupling the voltage VPERI to a node of the transistor 508. The transistor 508 (e.g., 429 of FIG. 4) has nodes coupled between a node of the transistor 503 (which may be supplying the voltage VPERI if the signal LIOPSf is at a low logical level) and a signal gio_gate. The transistor 508 may be a p-type transistor and may have a gate coupled to LIOf. The transistor 512 (e.g., 416 of FIG. 4) has a first node coupled to a ground voltage and a second node coupled to a node of transistor 510 and anode of transistor 514. The transistor 512 may be an n-type transistor with a gate coupled to a select read signal SelRd. Accordingly, when the signal SelRd is at a high logical level (e.g., during a read operation), the nodes of transistors 510 and 514 may be coupled to aground voltage. The transistor 510 (e.g., 422 of FIG. 4) has nodes coupled between the transistor 512 (which may supply a ground voltage during a read operation) and the signal line carrying gio_gate. The transistor 510 (e.g., 422 of FIG. 4) may be an n-type transistor, with a gate coupled to LIOf. A transistor 514 (e.g., 414 of FIG. 4) has nodes coupled between the transistor 512 (which may provide a ground voltage during a read operation) and the GIOf. The transistor 514 may be an n-type transistor with a gate coupled to gio_gate.

Accordingly, the transistors 508 and 510 may act as an inverter for the voltage along LIOf to a voltage of the signal gio_gate when the transistors 503 and 512 are active (e.g., when the signal LIOPSf is low and the signal SelRd is high). If the voltage on LIOf is high (e.g., because a high logical value is read from BLB), then transistor 510 may be active and the voltage gio_gate may be coupled to ground. If the voltage on LIOf is low (e.g., because a low logical value is read from BLB), then transistor 508 may be active and the voltage gio_gate may be coupled to VPERI, which may in turn activate the transistor 514 to couple GIOf to ground. Accordingly, when the voltage LIOf is low, the voltage GIOf may also be driven low.

As part of a read operation, the line GIOf may be pre-charged to a voltage which represents a high logical level. If the voltage along the LIOf is a high logical level (e.g., a voltage such as VPERI), the voltage gio_gate may be low, and the transistor 514 may remain inactive. Accordingly, the GIOf may remain at the voltage which represents a high logical level. If the voltage along LIOf is at a low logical level (e.g., a ground voltage), then the voltage gio_gate may be at a high level, and the transistor 514 may be active, coupling the GIOf to ground (which represents a low logical level).

Figure 6:
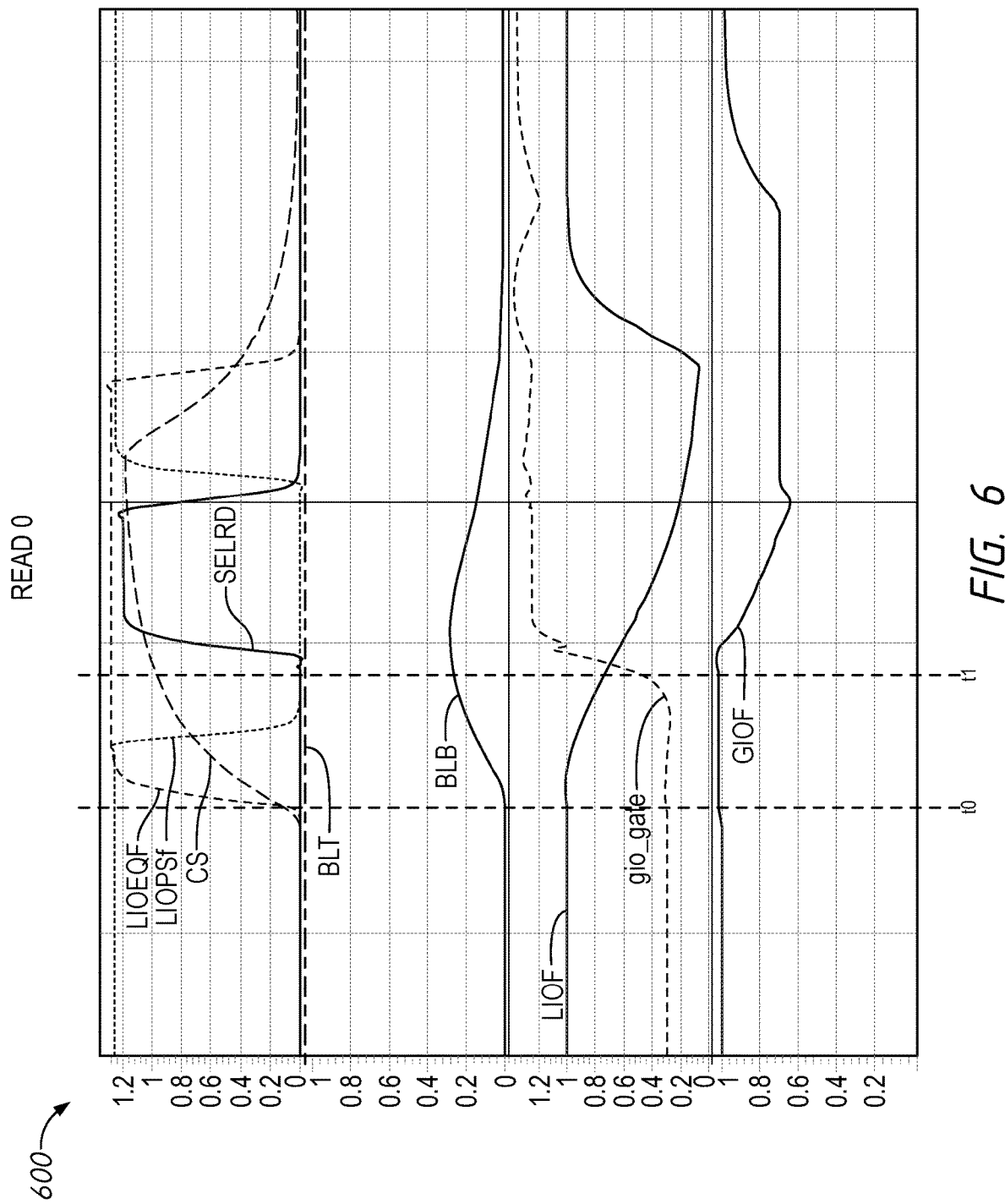
FIGS. 6 and 7 are graphs showing example read operations according to some embodiments of the present disclosure.
Figure 7:
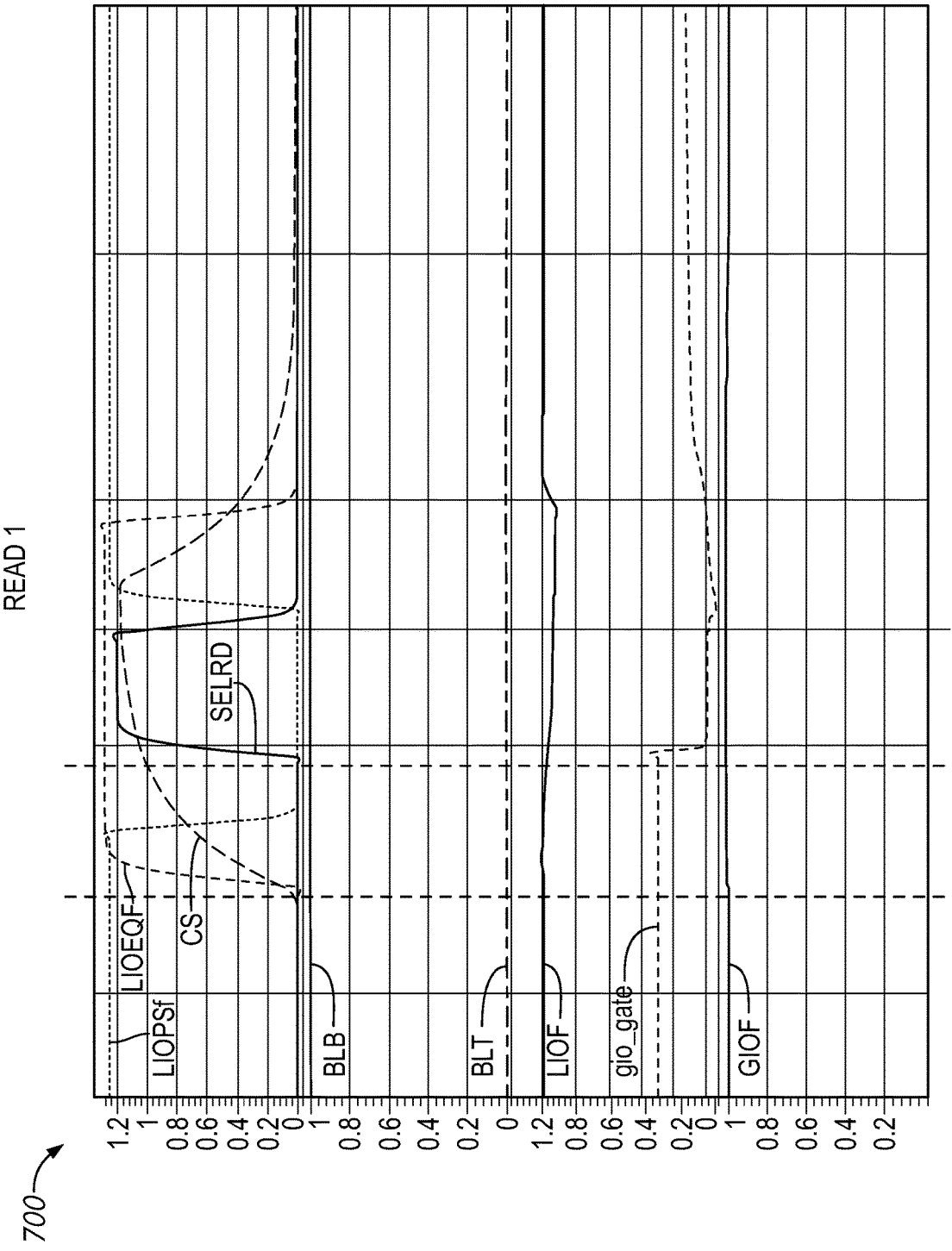

FIGS. 6 and 7 are graphs showing example read operations according to some embodiments of the present disclosure. The graph 600 of FIG. 6 shows an example operation where a low logical level is read out from the memory cell coupled to BLB, while the graph 700 of FIG. 7 shows an example operation where a high logical level is ready out from the memory cell coupled to BLB. The graphs of FIGS. 6 and 7 may, in some embodiments, represent the operation of read architecture of a memory as described in FIGS. 4 and 5. For the sake of clarity, reference will be made to the components and reference numbers of FIG. 5 to describe the relationship between the signals in FIGS. 6 and 7.

The graph 600 of FIG. 6 shows an initial time t0 when a read operation begins. The signal CS rises to an active level, which couples the bit line BLB to the local input/output LIOf. Accordingly, starting at t0, the voltage on LIOf begins to fall. Around the initial time to, the signal LIOPSf is driven to a low level (e.g., to activated the transistor 503 and couple the inverter formed by transistors 508 and 510 to the voltage VPERI), and the signal LIOEQf rises to an active level, to inactivate the transistor 504. The switching of various signals may cause the voltage on BLB to rise a bit as it is coupled to the higher voltage along the LIOf, even as the voltage along LIOf falls.

At a time t1, the signal SelRd may also become active to activate the transistor 512 and couple the inverter formed by transistors 508 and 510 to a ground voltage. This may cause the voltage gio_gate to begin to rise, as the inverter is now powered, and the voltage along LIOPSf is low. The rising voltage along gio_gate activates transistor 514, which in turn couples GIOf to ground (via the transistor 512). This causes the voltage on GIOf to fall, which may be read by the RW amplifier as a low logical level (e.g., the value read out from the memory cell coupled to BLB).

The graph 700 of FIG. 7 shows an example read operation similar to the one shown in FIG. 6, except that in FIG. 7 the value read is a high logical value. Since many features may be similar, for the sake of brevity, features similar to those already described with respect to FIG. 6 will not be repeated again with respect to FIG. 7.

In the graph 700, the read operation begins at the time t0 with the signals LIOEQf and CS rising to active levels, while the signal LIOPSA falls to a low logical level. The voltage BLB is at a high logical level, as the memory cell coupled to BLB is reading out a high value. Accordingly, the voltage on LIOf remains high. At a time t1, the signal SelRd rises to a high logical level, which powers the inverter. This causes the voltage of gio_gate to fall, since the input voltage to the inverter LIOf is high. Since the voltage gio_gate is low, the transistor 514 remains inactive, and the voltage of GIOf stays high. A read write amplifier may read the high voltage along GIOf as a high logical level.

Figure 8:
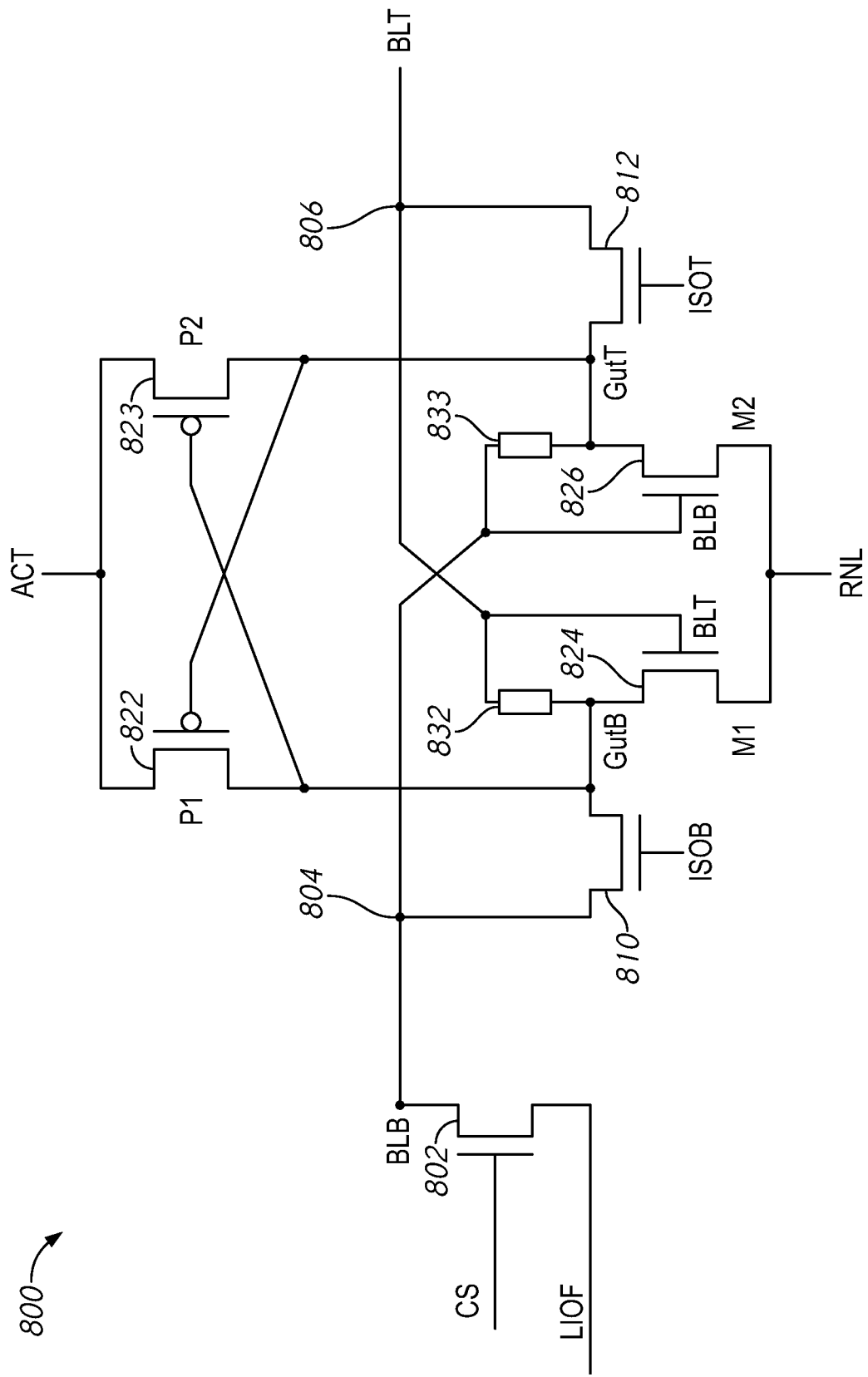
FIG. 8 is a schematic diagram of a sense amplifier according to some embodiments of the present disclosure.

FIG. 8 is a schematic diagram of a sense amplifier according to some embodiments of the present disclosure. The sense amplifier 800 may, in some embodiments, be included in the sense amplifier SAMP of FIG. 1 and/or the sense amplifier regions 210 of FIGS. 2, 304, and/or 430 of FIG. 4. The sense amplifier 800 selectively amplifies a signal on the bit lines BLB and BLT. The sense amplifier 800 will generally be described with respect to a write operation (e.g., a signal on LIO being written to a memory cell along BLB). However, it should be understood that the sense amplifier 800 may also be used as part of a read operation.

The sense amplifier 800 may be coupled to a pair of complimentary bit lines BLB and BLT, but only a single LIO (here labelled LIOf). Since a write select transistor (e.g., 412 of FIG. 4) is active due to the signal SelWr being active, the LIOf may be coupled to a GIOf, and from there to a read write amplifier. Accordingly, the voltage on the GIOf may be written through the LIOf to the bit line BLB, and the sense amplifier 800 may set the voltage on the bit lines BLB and BLT based on the voltage along LIOf.

The sense amplifier 800 includes a pair of isolation transistors 810 and 812. These isolation transistors 810 and 812 may be coupled to respective isolation signals ISOB and ISOT respectively. The two isolation signals ISOB and ISOT may be operated independently from each other as part of a write operation. This may allow the signal from the single LIO (e.g., LIOf) to be written to the two complimentary bit lines BLB and BLT.

A first transistor 802 (e.g., transistor 432 of FIG. 4) may be activated by a column select signal CS to couple LIOf to the bit line BLB. The transistor 802 has a node coupled to the bit line BLB, a node coupled to LIOf, and a gate coupled to the column select signal CS. The transistor 802 may be an n-type transistor.

The sense amplifier 800 includes p-type transistors P1 822 and P2 823 and n-type transistors M1 824 and M2 826. The transistor P1 822 has a node coupled to a signal ACT, a node coupled to a node GutB, and a gate coupled to a node GutT. The node GutB may be coupled through a transistor 832 to the bit line BLB, and the node GutT may be coupled through a transistor 833 to the bit line BLT. The transistors 832 and 833 may be inactive during write operation. The transistor P2 823 has a node coupled to ACT, a node coupled to node GutT, and a gate coupled to node GutB. The transistor M1 has a node coupled to the node GutB, a node coupled to the signal RNL, and a gate coupled to the bit line BLT. The transistor M2 has a node coupled to the node GutT, a node coupled to the signal RNL, and a gate coupled to the bit line BLB. During access operations, the signals ACT and RNL may be set to system voltages which represent a logical high and a logical low value, respectively.

A first isolation transistor 810 is coupled between the bit line BLB and the node GutB. The first isolation transistor 810 has a gate coupled to a signal ISOB. The first isolation transistor 810 may act as a switch and may couple the bit line BLB to the node GutB when the signal ISOB is active. The first isolation transistor 810 may be an n-type transistor which is active when the signal ISOB is at a logical high. The sense amplifier also includes a second isolation transistor 812, analogous to the first isolation transistor 810. The second isolation transistor 812 is coupled between the bit line BLT and the node GutT, with a gate coupled to a signal ISOT. When the signal ISOT is active, the second isolation transistor 812 couples the bit line BLT 806 to the gut node GutT.

The isolation transistors 810 and 812 may be operated separately during a write operation to help prevent conflicts between the signal provided to the bit line BLB as part of a write operation and the states of P1 and M1. For example, during an example write operation, if the bit line BLB is being written to a high value (e.g., from a 0 to a 1) the bit line BLB may cause a conflict with M1 if the transistor 810 is active. Similarly, during an example write operation where a low value is being written (e.g., BLB is going from a voltage representing a logical high to a voltage representing a logical low) the pull down of BLB may present a conflict with P1 if the transistor 810 is active. Accordingly, the signal ISOB may be pulsed inactive during a write operation to prevent these conflicts. The operation of the sense amplifier during example write operations is discussed in more detail in FIGS. 9 and 10.

Figure 9:
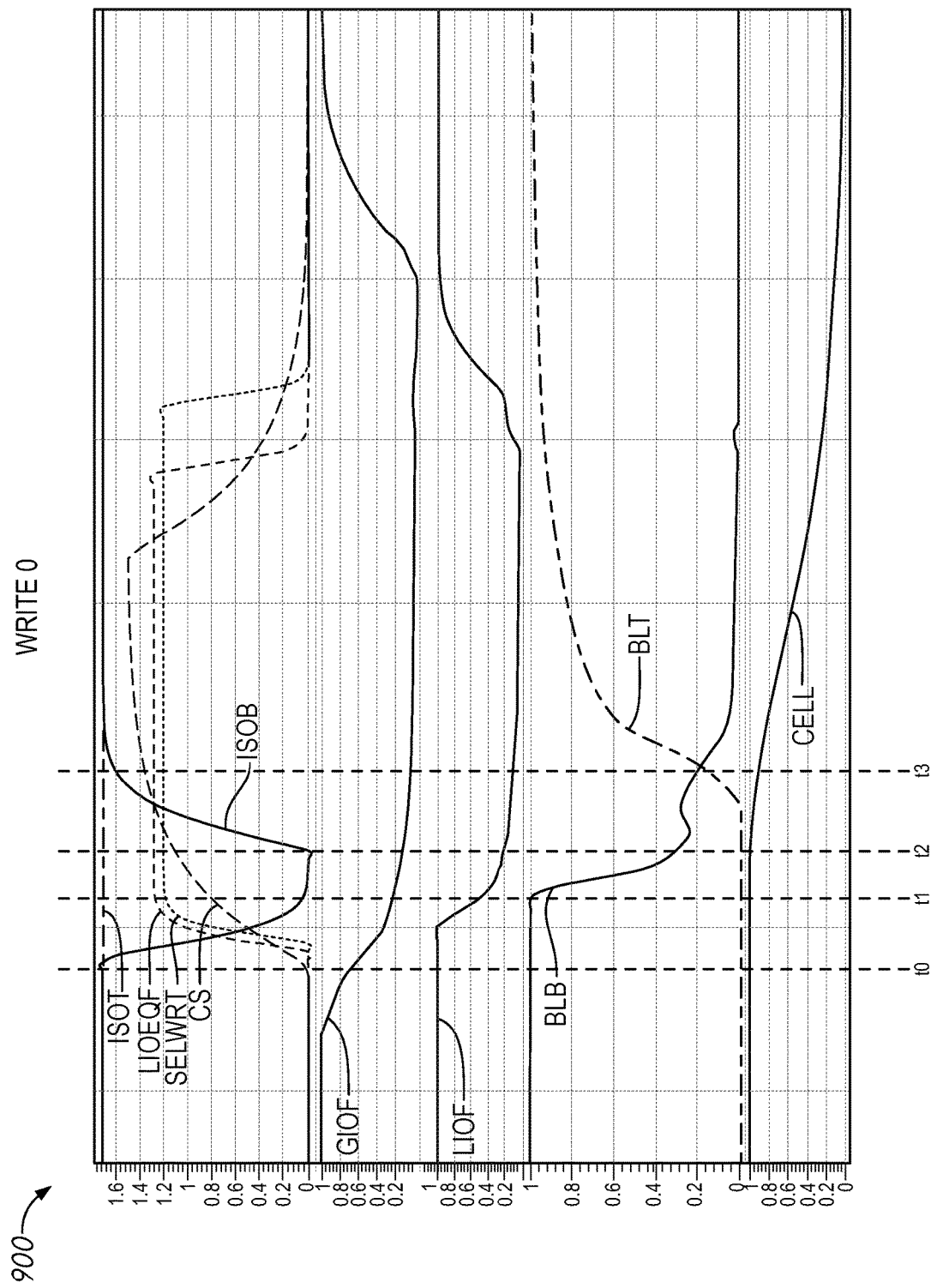
FIGS. 9 and 10 are timing diagram of example write operations in a sense amplifier according to some embodiments of the present disclosure.
Figure 10:
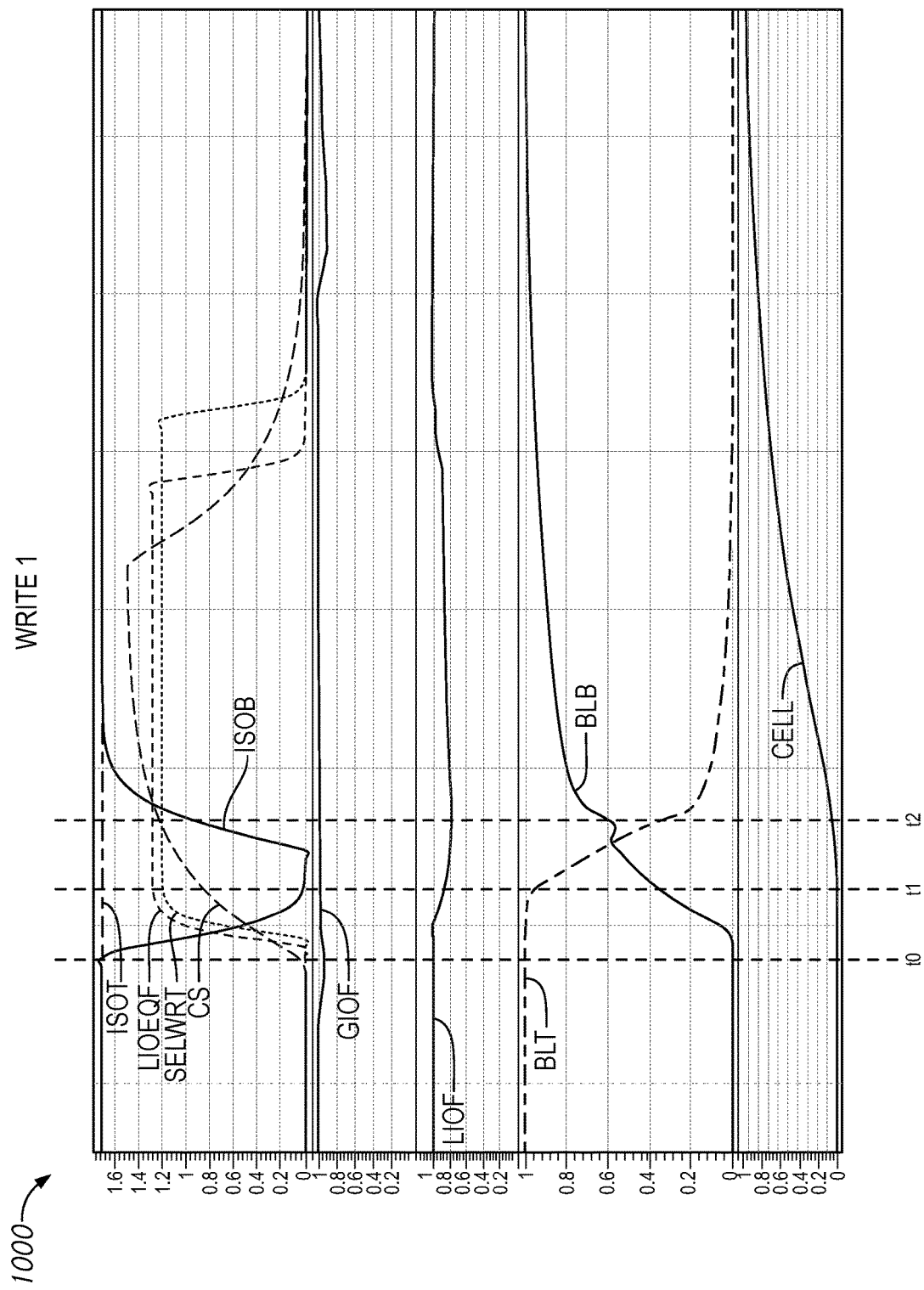

FIGS. 9 and 10 are timing diagram of example write operations in a sense amplifier according to some embodiments of the present disclosure. FIG. 9 shows a write operation where a logical low value is written to the bit line BLB, which in turn causes a logical high to be written to BLT. FIG. 10 shows an example write operation where a logical high is written to the bit line BLB, which in turn causes a logical low to be written to the bit line BLT. In explaining the operations shown in FIGS. 9 and 10, reference will be made to features discussed in FIGS. 4, 5, and 8.

FIG. 9 shows a graph 900 of different signals in an example sense amplifier, such as the sense amplifier 800 of FIG. 8, during a write operation where a logical low is written to the bit line BLB. Before an initial time t0, the voltage on the GIOF begins falling from a voltage which represents a high logical value to a voltage which represents a low logical value. At the initial time t0, a signal ISOB is driven from a high logical level to a low logical level. This may inactivate the first isolation transistor 810, decoupling the bit line BLB 804 from the gut node GutB. The signals LIOEQf, CS, and SelWr may rise from a low logical level to a high logical level. The signal LIOEQf may inactivate transistor 424, which may decouple the LIOf from the voltage VPERI. The signal SelWr becoming active may instead couple LIOf to the signal along GIOf by activating the transistor 412. The column select signal CS may activate transistor 432 and couple the LIOf to the bit line BLB. Note that throughout the write operation, while the signal ISOB changes from high to low to high, the signal ISOT remains high.

At a first time t1, the voltage on BLB begins to fall, as the falling voltage on GIOf is coupled to the bit line BLB through the LIOf. The falling voltage on BLB may cause the transistor 826 to inactivate, which may decouple the voltage GutT from the signal RNL (which may be a voltage representing a logical low. Since the transistor 812 is still active (e.g., since ISOT remains high), the voltage BLT may be coupled to the voltage of GutT.

At a second time t2, the isolation signal ISOB may begin to rise to an active level again. The isolation signal ISOB may activate the transistor 810, which may couple the falling voltage on BLB to the node GutB. The falling voltage on GutB may in turn activate transistor 823, which may couple the signal ACT (set to a system voltage representing a high logical level) to the voltage GutT. Since the node GutT was previously uncoupled from the low logical voltage on RNL as the voltage BLB fell and transistor 826 was inactivated, this may cause the voltage on the node GutT to be quickly pulled up to the voltage on ACT, which is shown beginning between the times t2 and t3. Accordingly, as the voltage on BLB falls and the voltage on BLT rises, the transistors 826 may be inactive, which allows the voltage on the bit line BLT to be driven up by the activated transistor 823, while the transistor 824 may become active, further driving the bit line BLB and the node GutB to a low voltage. At the time t3, the voltages on the bit lines BLT and BLB may cross (e.g., after the time t3, the voltage of BLB may be lower than the voltage of BLT). This may represent that the state of the bit lines has switched, and that the low logical value has been written to the bit line BLB, while a high value has been written to the bit line BLT.

FIG. 10 is a graph 1000 of an example write operation where the bit line BLB is driven from a low logical level to a high logical level. Since the graph 1000 may be broadly similar to the graph 900 of FIG. 9, for the sake of brevity features and operations similar to those described with respect to FIG. 9 will not be repeated again for FIG. 10.

The graph 1000 shows that at a time t0, the control signals LIOEQf, SelWt, and CS all become active, while the isolation signal ISOB is pulsed inactive. In contrast to the graph 900, in the graph 1000, the GIOf remains at a high voltage, as does the LIOf, since a high value is being written to BLB. Accordingly, shortly after the time t0, the voltage on BLB begins rising, which at the time t1, causes the voltage on BLT to begin falling. After the time t2, the voltages on BLB and BLT cross, with the voltage on BLT being lower than the voltage on BLB, indicating that a high value has been written to the bit line BLB.

Figure 11:
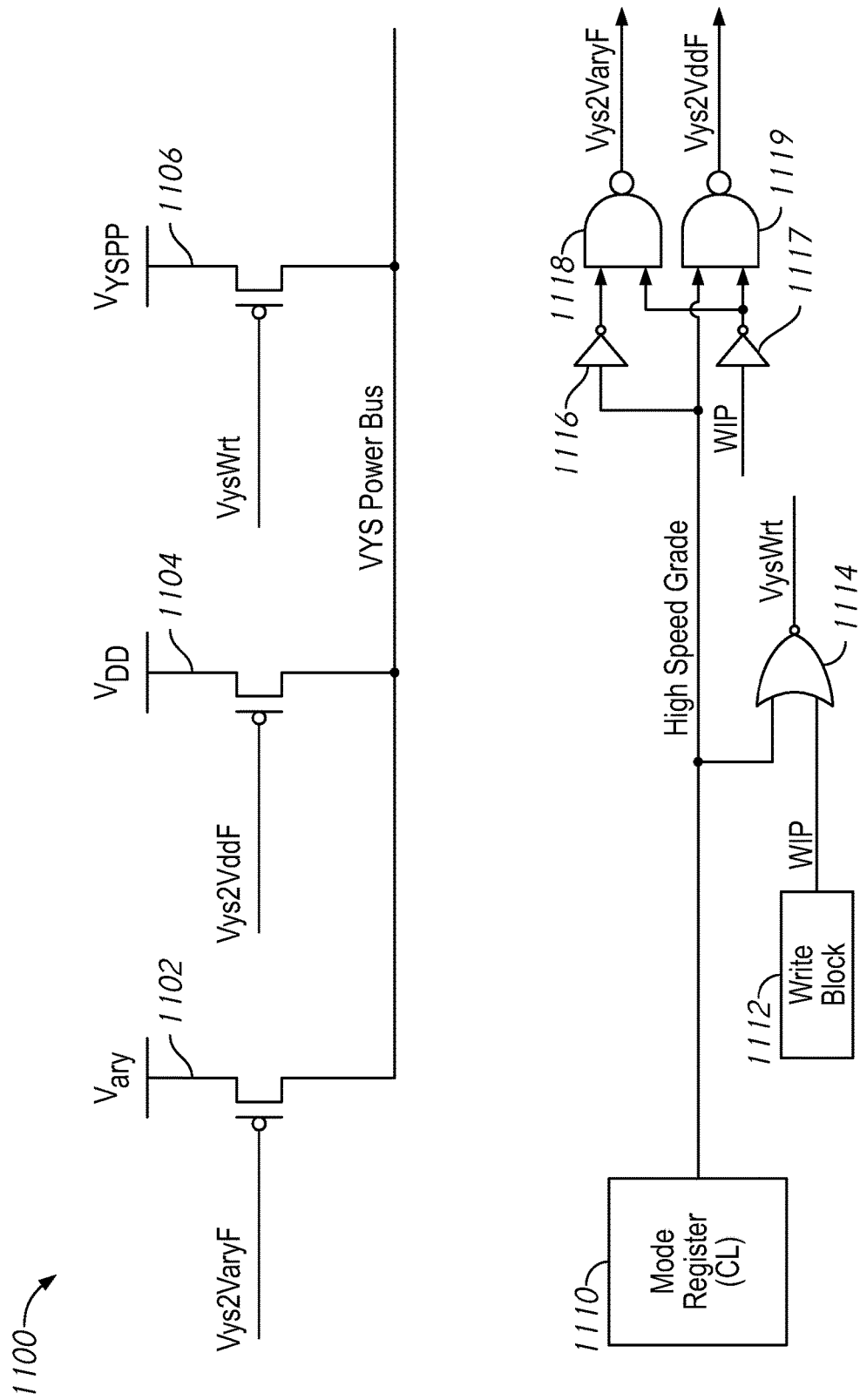
FIG. 11 is a schematic diagram of a voltage selector according some embodiments of the present disclosure.

FIG. 11 is a schematic diagram of a voltage selector according some embodiments of the present disclosure. The voltage selector 1100 may select a voltage for a VYS power bus, which in turn may be used to set the voltage of a column select signal CS, which is applied to the gate of a column select transistor (e.g., 432 of FIG. 4, 502 of FIG. 5, and/or 802 of FIG. 8). This may be useful in different operations of the memory, as otherwise there may be situations where the driving effect of the CS transistor is weak if the input to the CS transistor (e.g., BLB in a read operation or LIOf in a write operation) and the voltage of the CS signal are both high.

The voltage selector 1100 includes a number of transistors 1102-1106, each of which acts a switch to couple a different voltage to a VYS power bus, which is used to determine the voltage level of the signal CS when it is active. Each transistor 1102-1106 has nodes coupled between a respective voltage and the VYS power bus. Each transistor 1102-1106 has a gate coupled to a different control signal. Since in the example of FIG. 11 p-type transistors are used, which of the control signals is at a low logical level may determine which voltage is coupled. So a signal Vys2VaryF is used to provide a voltage Vary, a signal Vys2VddF is used to provide a voltage Vdd, and a signal VysWrt is used to provide a voltage Vyspp. The voltage Vary may be less than the voltage Vdd which may be less than Vyspp. In some embodiments, Vary may be about 1V, Vdd may be about 1.2 V, and Vyspp may be about 1.5 V.

The different control signals may be provided based on a signal from a mode register 1110, and a state of a write operation provided by a write logic block 1112. The mode register 1110 may provide a speed signal which may be at a high or low level based on the column address strobe (CAS) latency, or CL, set in the mode register. The speed signal may indicate if the memory is set up for high speed operations or not. The write block 1112 may provide a write in progress WIP signal which may indicate if a write operation is in progress.

NOR gate 1114 may provide a signal VysWrt at a low level (e.g., providing the voltage Vyspp as the voltage on the VYS power bus) unless both the WIP and speed signal are at a low level. In other words, as long as either the memory is in a high speed mode, or a write operation is occurring, the voltage Vyspp may be provided as the voltage along the VYS power bus.

A first NAND gate 1118 provides the signal Vys2VaryF, and has a first input terminal coupled to the speed signal through an inverter 1116 and a second input terminal coupled to WIP through an inverter. The signal Vys2VaryF may only be provided at a low level when WIP is low and when speed signal is low. Accordingly, the voltage Vary may be provide along the VYS power bus when a write operation is not in progress and a slow CL is indicated by the mode register.

A second NAND gate 1119 has a first input terminal coupled to the speed signal and a second input terminal coupled through an inverter to the WIP signal. Accordingly, the signal Vys2VddF will only be provided at a low level when the speed signal is at a high level and the signal WIP is at a low level. Thus the voltage Vdd may be provided along the VYS power bus when a write operation is not in progress and a fast CL is indicated by the mode register 1110.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus, comprising:
a single ended local input/output (LIO) line selectively couplable to a bit line as part of a read operation, the bit line coupled to a memory cell;
a sense amplifier coupled to the bit line;
an inverter configured to provide a gate voltage based on a voltage of the LIO line; and
a transistor configured to selectively couple a single ended global input/output (GIO) line to a ground voltage based on the gate voltage, wherein
the bit line is configured to provide a voltage to the sense amplifier based on logical value stored in the memory cell as part of the read operation, and
the sense amplifier is configured to amplify the voltage and provide the amplified voltage to the single ended LIO line, wherein
the single ended LIO line is coupled to the bit line when a column select signal is active,
the single ended LIO line couples the sense amplifier to the single ended GIO line,
the single ended GIO line is coupled to a read/write amplifier,
the sense amplifier includes a first isolation transistor and a second isolation transistor, and
as part of a write operation, the first isolation transistor is inactivated while the second isolation transistor remains active.

2. The apparatus of claim 1, wherein
the single ended GIO line is charged to a first voltage as part of the read operation, and
the single ended GIO line is coupled to a second voltage if the gate voltage activates the transistor.

3. The apparatus of claim 2, wherein the first voltage represents a logical high and wherein the second voltage represents a logical low.

4. The apparatus of claim 1, wherein
the inverter comprises a first transistor and a second transistor, and
the first transistor is located in a minigap region.

5. The apparatus of claim 4, wherein the second transistor is located in a read/write gap region or in the minigap region.

6. The apparatus of claim 1, wherein the transistor is located in a read/write gap region.

7. The apparatus of claim 1, further comprising a second transistor configured to activate the inverter responsive to a select read signal at an active level.

8. An apparatus comprising:
a sense amplifier coupled to a first digit line and a second digit line;
a local input/output (LIO) signal line coupled to the first digit line;
a first isolation transistor configured to couple the first digit line to a first gut node of the sense amplifier when active;
a second isolation transistor configured to couple the second digit line to a second gut node of the sense amplifier when active, wherein during a write operation, the first isolation transistor is deactivated while the second isolation transistor remains active.

9. The apparatus of claim 8, wherein the first isolation transistor is controlled by a first isolation signal and the second isolation transistor is controlled by a second isolation signal.

10. The apparatus of claim 9, wherein during the write operation, the first isolation signal is pulsed from an active to an inactive level, and the second isolation signal remains active.

11. The apparatus of claim 8, further comprising a column select transistor configured to couple the first digit line to the LIO signal line when a column select signal is active.

12. The apparatus of claim 11, wherein the column select signal becomes active when the first isolation transistor is deactivated.

13. The apparatus of claim 8, wherein the LIO signal line is coupled to a global input/output signal line when a write select signal is active.

14. An apparatus, comprising:
 a memory array;
 a sense amplifier:
 a single ended local input/output (LIO) line coupled to a digit line when a column select signal is active;
 a single ended global input/output (GIO) line coupled to a read/write amplifier; and
 a voltage selector configured to set a voltage of the column select signal, wherein
 the single ended LIO line couples the sense amplifier to the single ended GIO line, and
 the voltage selector is further configured to provide the column select signal at a first voltage during a write operation, at a second voltage when a memory is in a high speed mode and a write operation is not happening, and at a third voltage when a memory is not in a high speed mode and a write operation is not happening.

15. The apparatus of claim 14, further comprising an inverter configured to generate a gate voltage during a read operation based on a voltage of the single ended LIO line, wherein the single ended GIO line is coupled to a ground voltage if the gate voltage is at an active level.

16. The apparatus of claim 15, wherein the inverter is activated when a select read signal is at an active level.

17. An apparatus, comprising:
 a memory array;
 a sense amplifier:
 a single ended local input/output (LIO) line coupled to a digit line when a column select signal is active; and
 a single ended global input/output (GIO) line coupled to a read/write amplifier, wherein
 the single ended LIO line couples the sense amplifier to the single ended GIO line,
 the sense amplifier includes a first isolation transistor and a second isolation transistor, and
 as part of a write operation, the first isolation transistor is inactivated while the second isolation transistor remains active.

18. The apparatus of claim 17, wherein the first isolation transistor is inactivated when a column select signal is activated.

* * * * *